United States Patent [19]
Volluet et al.

[11] 4,316,162
[45] Feb. 16, 1982

[54] MAGNETOSTATIC WAVE DEVICE CONTAINING ATTENUATION MEANS AND THE WAY OF MAKING IT

[75] Inventors: Gerard Volluet; Daniel Cohen, both of Paris, France

[73] Assignee: Thomson-CSF, Paris, France

[21] Appl. No.: 155,676

[22] Filed: Jun. 2, 1980

[30] Foreign Application Priority Data
Jun. 6, 1979 [FR] France .................. 79 14439

[51] Int. Cl.³ ........................... H03H 2/00
[52] U.S. Cl. ................ 333/201; 333/24 R; 333/150
[58] Field of Search ............ 310/26; 333/141–148, 333/201, 150–155, 193–196, 24.1, 24.2, 81 R, 81 A, 81 B, 24 R; 350/375–383; 365/3, 48, 52, 74, 157–159, 171–173, 192, 197–199; 51/413, 310–312

[56] References Cited

U.S. PATENT DOCUMENTS

| | | | |
|---|---|---|---|
| 4,001,796 | 1/1977 | Voegeli | 365/3 |
| 4,051,448 | 9/1977 | Coussot | 333/194 X |
| 4,199,737 | 4/1980 | Patterson et al. | 333/156 X |

OTHER PUBLICATIONS

Watkins–"A Survey of Thin–Film Technology", Electronic Industries, Sep. 1961; pp. 92–98.

Primary Examiner—Marvin L. Nussbaum
Attorney, Agent, or Firm—Cushman, Darby & Cushman

[57] ABSTRACT

The invention relates to bulk or surface magnetostatic wave devices. The invention provides in the ferrimagnetic substrate of such a device, at least one area with absorption increased by a treatment consisting in local sanding of the substrate or its support to produce several defects by the impact of abrasive particles. The invention is applicable to magnetostatic wave lines and filters.

11 Claims, 6 Drawing Figures

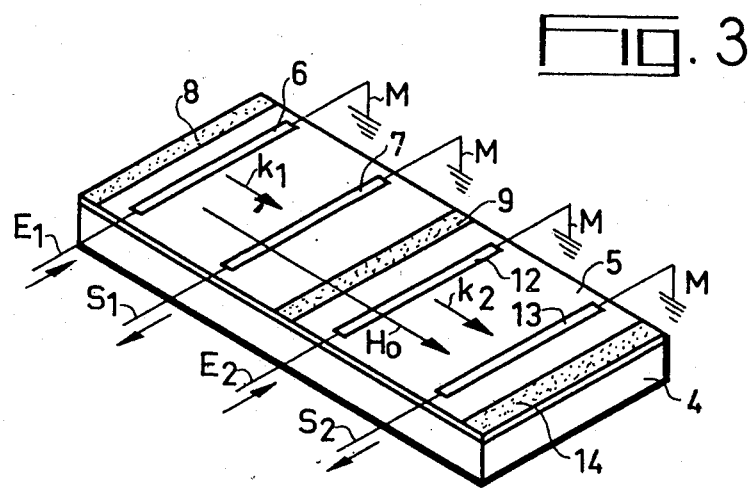
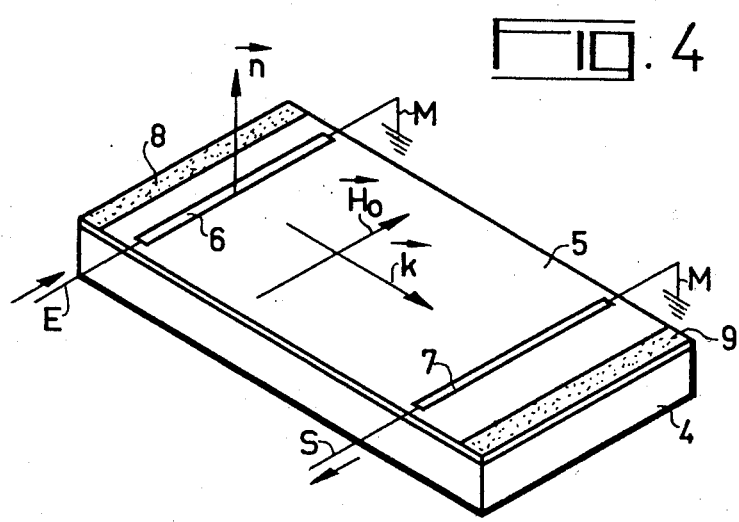

MAGNETOSTATIC WAVE DEVICE CONTAINING ATTENUATION MEANS AND THE WAY OF MAKING IT

The present invention relates to magnetostatic wave devices which contain a ferrimagnetic sheet on whose surface filamentary energizing electrodes are arranged. When an alternating current of suitable frequency is made to circulate along these electrodes and the sheet is subjected to a polarizing magnetic field whose strength is chosen as a function of this frequency, bulk or surface magnetostatic waves are emitted perpendicularly to the direction of the energizing current. These waves may be picked up by another electrode and this gives rise to an induced current. With two strip electrodes arranged opposite each other and acting as transmission and reception transducers respectively, transmission by magnetostatic waves with a given transfer function may be obtained. However, this transfer function has spurious waves in it produced by the reflections that the magnetostatic waves are subject to when they reach the edges of the ferrimagnetic sheet.

To attenuate this disadvantage, the edges of the ferrimagnetic sheet may be treated in such a way as to reduce the magnetostatic wave reflections. For this purpose, the method may be mentioned which consists in cutting the edges of the ferrimagnetic sheet at an angle with respect to the direction of propagation of the magnetostatic waves. The effect of this is to lengthen the path of the reflected waves before they reach the transducers but this method, whose effectiveness is only partial, causes a waste of material since the ferrimagnetic sheet has to be cut with a bevelled edge. Another solution consists in rubbing down the edges of the sheet with a tool loaded with abrasive material but it is difficult to obtain in reproducible fashion a sufficiently progressive transition between the parts rubbed down and the part not rubbed down for the reflections to be greatly reduced. A reduction of the reflections may also be obtained by deposing on the ferrimagnetic sheet a magnetic ribbon or magnetic particles with big losses but the discontinuity of the magnetic properties of this deposit and the substrate is a cause of reflection. In the case of the technology using a ferrimagnetic garnet such as an yttrium and iron garnet as substrate, a deposit of a similar material with big magnetic losses such as a terbium and iron garnet may be obtained by epitaxy. This technolgy is expensive and complicated however and a reflection factor still remains since this deposit introduces a thickness discontinuity.

The way to make substrates for magnetostatic wave devices with low attenuation is now known. For this purpose, a support of a galodinium and gallium garnet (GGG) is taken as the base, the surface having been carefully polished to give a low level of defects, less than $1/cm^2$ for example. On this support, a thin film of yttrium and iron garnet (YIG), for which the width of the ferrimagnetic resonance ray does not exceed a fraction of an Oersted, is grown by epitaxy in the gaseous or liquid phase. This gives propagation losses of the order of 38 dB/$\mu$sec in the X band. In order to obtain high attenuation locally without producing a discontinuity likely to cause reflections, the invention intends to use a sanding technique which causes, on the film surface, a large number of microscopic defects thanks to which the ferrimagnetic resonance ray may be considerably widened to make the film more absorbent locally.

The purpose of the invention is the production of a magnetostatic wave device with localized attenuation means on a ferrimagnetic substrate which can receive magnetostatic waves coming from transducers formed by filamentary electrodes, characterized by the fact that these attenuation means contain at least one area whose attenuation has been considerably increased by local treatment which causes defects in the surface resulting from impacts due to the local action of a jet of abrasive particles.

The purpose of the invention is also the way of making the above-mentioned device, which consists in masking the areas of the substrate which are not to have superficial defects and to sand the areas remaining so as to increase considerably the attenuation of magnetostatic waves without forming a sufficiently steep discontinuity to reflect them.

The invention will be better understood by means of the following description and the figures attached, in which:

FIG. 3 shows two magnetostatic wave devices on the same ferrimagnetic substrate, FIG. 4 shows a variant in the production of the magnetostatic wave device in FIG. 1.

Figure 1:
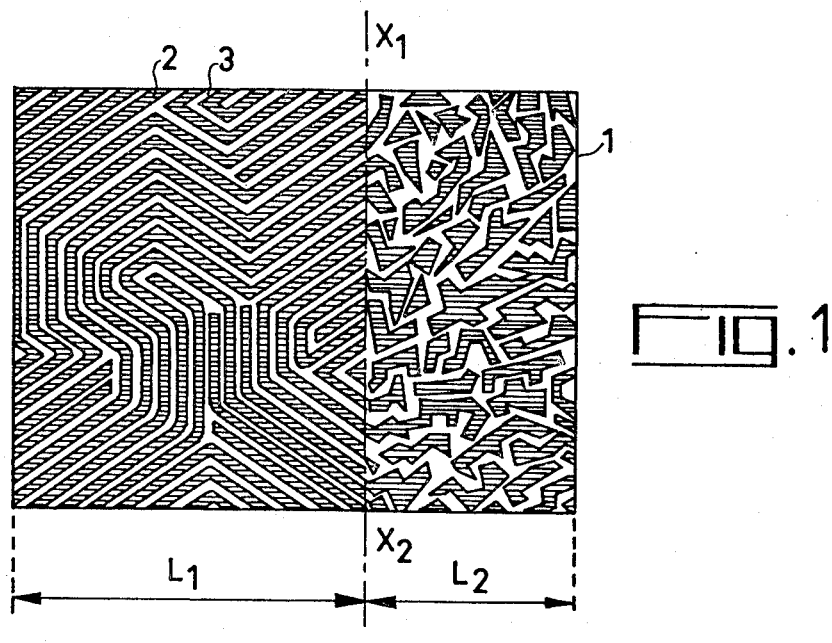
FIG. 1 shows the structure of the areas in an epitaxial ferrimagnetic layer.

FIG. 1 shows the structure of a thin ferrimagnetic film 1 whose part $L_1$ on the left of axis $X_1X_2$ is almost free of defects and whose part $L_2$ on the right of axis $X_1X_2$ has been superficially damaged by sanding. This structure may be made visible in a weak or zero magnetic field by means of a polarizing microscope in the case in which the ferrimagnetic sheet is thin enough to allow observation by optical transmission. By the Faraday effect, magnetic areas 2 and 3 can be distinguished. In the region $L_1$ these areas are in the form of clear and dark domains in a layout of regular aspect. The space between the domains changes with the intensity of the magnetic field applied. The high mobility of the domains when a field of low intensity is applied enables this region to be identified as that in which the magnetostatic waves can propagate with low attenuation. On the other hand, the sanding applied in region $L_2$ has produced many defects in the surface which have completely changed the aspect of the magnetic domains. These are split up in very irregular fashion and their mobility is almost zero when the magnetic field varies.

Experience shows that a light sanding, which does not cause marked discontinuity between the regions $L_1$ and $L_2$, has completely changed the aspect and mobility of the magnetic domains. Also, if region $L_2$ receives a magnetostatic wave, it attenuates the wave much more than region $L_1$ does. The magnetostatic wave suffers almost complete attenuation in a distance of 2 mm in region $L_2$. The absence of marked discontinuity causes there to be no reflection when line $X_1X_2$ is crossed. Apart from the losses, the magnetic properties of regions $L_1$ and $L_2$ are the same. Observation based on the Faraday effect enables the sanding action to be dosed in density, time and nozzle-sample distance to satisfy the criterion of disturbance of the magnetic areas, i.e. their irregular aspect and absence of mobility.

Figure 2:
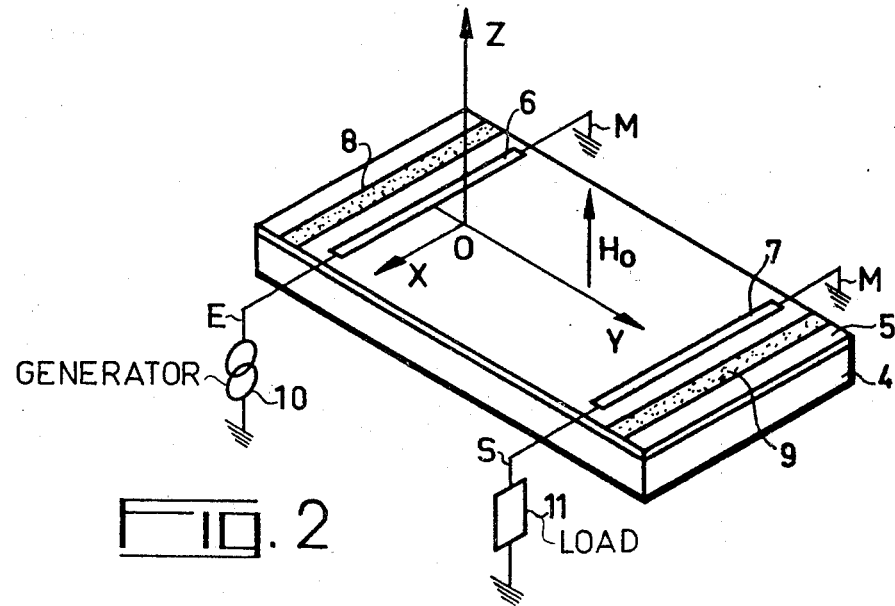
FIG. 2 is an isometric view of a first magnetostatic wave device in accordance with the invention.

The magnetostatic wave device in FIG. 2 applies the sanding technique to absorb the bulk magnetostatic waves caused by filamentary electrode 6. The device consists, for example, of a support 4 of galodinium-gallium garnet on which a film 5 of yttrium-iron garnet has been deposited by epitaxy. A magnetic field $H_o$ is applied perpendicularly to the surface XOY of film 5. The bulk magnetostatic wave emitting transducer is formed by the electrode 6, which is turned parallel to the axis OX. The input E of the emitting transducer is connected to an electric generator 10 and the opposite end is connected to the ground M. Transducer 6 radiates bilaterally. The waves radiated in the opposite direction to axis OY are absorbed by sanded area 8 which is in front of the rear edge of film 5. The waves radiated in the direction of axis OY are received by the receiving transducer 7, which is also formed by a filamentary electrode 7. Electrode 7 has one end connected to ground and the other end S feeds an electric load 11. The bulk magnetostaic waves which have crossed transducer 7 are absorbed by a sanded area 9 which is in front of the front edge of film 5. Evidently, the configuration of electrodes 6 and 7 is not limited to a single rectilinear element per transducer. A meander configuration may also be used in which the radiating elements form a grating or a grid of interconnected parallel bars. It is obvious that sanded areas 8 and 9 can be extended to the edges of film 9.

In FIG. 2 the attenuation areas 8 and 9 prevent the reflection of bulk magnetostatic waves. An attenuation area may also be used to prevent the transmission of magnetostatic waves between two devices arranged in series on a common substrate.

FIG. 3 shows such an arrangement in which the same references designate the same elements as in FIG. 2. The arrangement of FIG. 3 differs from the preceding one by the direction of the induced magnetic field $H_o$ which is in the plane of film 5 and perpendicular to electrodes 6, 7, 12 and 13. The waves exchanged are again bulk magnetostatic waves emitted bilaterally. Electrode 12 forms the emitting transducer of a second device $E_2S_2$ which is insulated from the first device $E_1S_1$ by the attenuation area 9. Electrode 13 acts as receiving transducer for the second exchange device. The attenuation area 14 is used to prevent the reflection of the magnetostatic waves which may have crossed transducer 13. It can be seen that the exchanges by bulk magnetostatic waves symbolized by the wave vectors $k_1$ and $k_2$ are effectively decoupled by the presence of attenuation area 9.

The creation of attenuation areas by sanding is also effective for preventing the transmission or reflection of surface magnetostatic waves.

The device in FIG. 4 differs from the device in FIG. 2 by the fact that the inductive field $H_o$ is turned parallel to conductor 6. In this case, the magnetostatic waves are surface waves energized preferably along a direction by transducer 6. The direction of emission is represented by the wave vector $\vec{k}$. The preferred direction of vector $\vec{k}$ is parallel to the vector product $\vec{H_o} \times \vec{n}$ in which $\vec{n}$ designates the normal to the surface of film 5 directed away from film 5. Attenuation area 9 absorbs the surface magnetostatic waves emitted by transducer 6 which have crossed receiver transducer 7. Attenuation area 8 allows the absorption of the residual waves which, in spite of the pseudo-unidirectional emission, may, be reflected at the rear edge of film 5.

Figure 5:
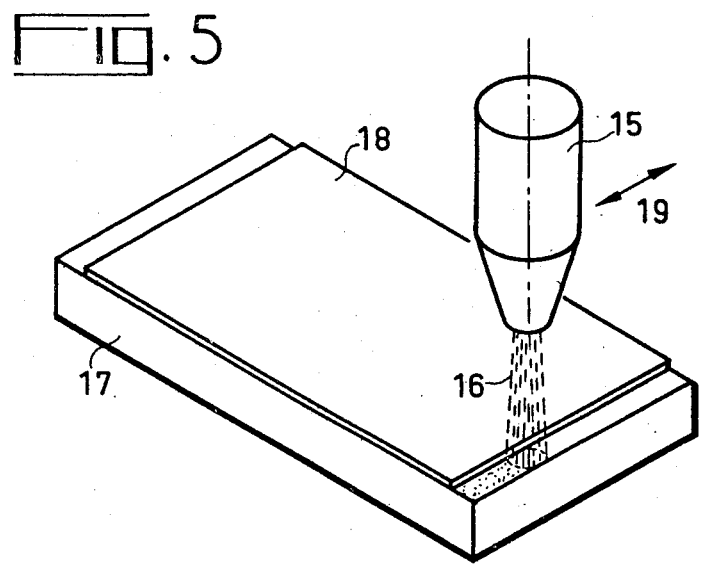
FIG. 5 shows the way of making the devices shown in FIGS. 2 to 4.

In FIG. 5 a ferrimagnetic substrate 17 may be seen during the sanding operation. The propagation area in which it is desired to retain a low attenuation is protected by a mask 18. The particle jet 16 comes from a nozzle 15 directed towards the unmasked absorption area. Nozzle 15 may be moved in direction 19 if the particle impact area 16 does not completely cover the required absorption area.

It may be noted that, in the case of a structure in which the ferrimagnetic material is deposited epitaxially on a previously polished support, sanding of the support surface may be done before epitaxy. When the epitaxy film grows, the support surface state is such that the required attenuation areas have many defects. Evidently, the attenuation areas are not so well marked out as when the sanding is done on the epitaxy film surface.

Figure 6:
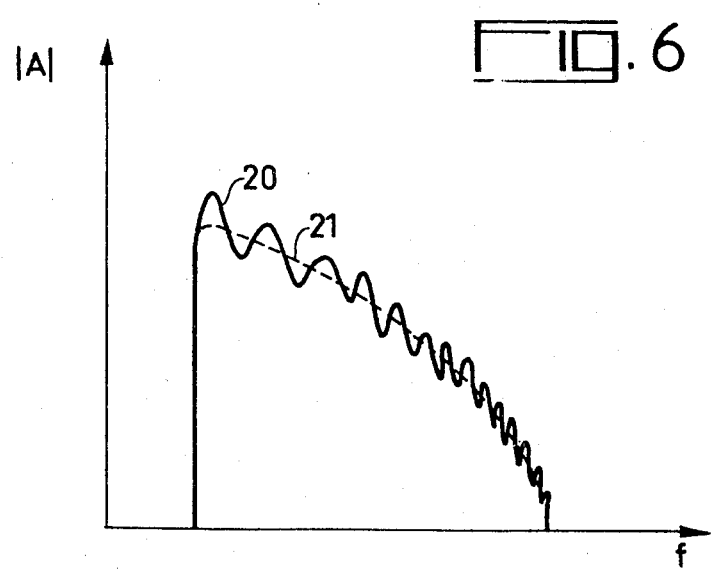
FIG. 6 shows the transfer function of a magnetostatic wave device.

FIG. 6 shows the improvement obtainad with the sanding technique described above. The diagram in FIG. 6 shows as a plain line the transfer function 20 of a magnetostatic wave device not fitted with attenuation areas. This transfer function contains waves due to interference reflections. When attenuation areas are provided by sanding, the transfer function appears much more regular as shown by the dotted curve 21. The frequency f is given as abscissae and the modulus $|A|$ of the transmission ratio is given as ordinates. The sanding technique is very simple to apply. As it does not introduce any noticeable discontinuity in the surface of the ferrimagnetic sheet, it is possible to apply patterns by photogravure which cover the sanded areas as their surface state is little damaged.

We claim:

1. A magnetostatic wave device comprising attenuator means localized on a ferrimagnetic substrate for receiving the magnetostatic waves coming from transducers formed by thread-like filamentary electrodes; said attenuator means including at least one area in which the attenuation has been considerably increased by a local treatment that produces defects in the surface of said substrate resulting from the impacts by local action of a jet of abrasive particles.

2. A device as in claim 1, wherein said area is a marginal absorbing area.

3. A device as in claim 1, wherein said area is inside the extent of the substrate; said area being an absorbant decoupling area between two or more cells exchanging magnetostatic waves.

4. A device as in anyone of claims 1 to 3, wherein said substrate is magnetically polarized to propagate bulk or surface magnetostatic waves.

5. A magnetostatic wave device comprising attenuator means localized in a ferrimagnetic substrate deposited epitaxially on a support for receiving the magnetostatic waves coming from transducers formed by threadlike filamentary electrodes; said attenuator means including at least one area in which the attenuation has been considerably increased by a local treatment that produces defects in the surface of said substrate resulting from the impacts by local action of a jet of abrasive particles.

6. A device as in claim 5, wherein said defects are on the free surface of said substrate.

7. A device as in claim 5, wherein said defects are at the interface betweeen said ferrimagnetic substrate and said support.

8. A method of manufacturing a magnetostatic wave device comprising the steps of masking the areas on a substrate which are not to have superficial damage and in sanding the remaining areas to increase the magnetostatic wave attenuation.

9. A method as claimed in claim 8, wherein the dosing in the sanding operation is monitored by an optical examination of the ferrimagnetic substrate showing up the magnetic areas and to display their irregular distribution and absence of mobility in the areas subjected to sanding.

10. A method as in claim 8, wherein the sanded surface is the free surface of said substrate.

11. A method of manufacturing a magnetostatic wave device comprising the steps of making the areas on a substrate which are not to have superficial damage and in sanding the polished surface of a support on which the substrate is epitaxially grown to increase the magnetostataic wave attenuation.

* * * * *